(12) United States Patent
Lomeli et al.

(10) Patent No.: US 11,177,276 B2
(45) Date of Patent: Nov. 16, 2021

(54) CONDUCTIVE STRUCTURES, ASSEMBLIES HAVING VERTICALLY-STACKED MEMORY CELLS OVER CONDUCTIVE STRUCTURES, AND METHODS OF FORMING CONDUCTIVE STRUCTURES

(71) Applicant: Micron Technology, Inc., Boise, ID (US)

(72) Inventors: Nancy M. Lomeli, Boise, ID (US); Tom George, Boise, ID (US); Jordan D. Greenlee, Boise, ID (US); Scott M. Pook, Meridian, ID (US); John Mark Meldrim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/542,675

(22) Filed: Aug. 16, 2019

(65) Prior Publication Data
US 2020/0075620 A1    Mar. 5, 2020

Related U.S. Application Data

(62) Division of application No. 15/852,955, filed on Dec. 22, 2017, now Pat. No. 10,424,596.

(51) Int. Cl.
*H01L 27/11582* (2017.01)
*H01L 29/10* (2006.01)
(Continued)

(52) U.S. Cl.
CPC .... *H01L 27/11582* (2013.01); *G11C 16/0483* (2013.01); *G11C 16/08* (2013.01);
(Continued)

(58) Field of Classification Search
CPC ......... H01L 27/11556; H01L 21/76877; H01L 23/53266; H01L 23/53271; H01L 23/528;
(Continued)

(56) References Cited

U.S. PATENT DOCUMENTS 6,191,027 B1 * 2/2001 Omura .............. H01L 21/76807
257/E21.579
6,586,842 B1 * 7/2003 You ................... H01L 21/76804
257/758
(Continued)

*Primary Examiner* — Alia Sabur
(74) *Attorney, Agent, or Firm* — Wells St. John P.S.

(57) ABSTRACT

Some embodiments include a conductive structure of an integrated circuit. The conductive structure includes an upper primary portion, with the upper primary portion having a first conductive constituent configured as a container. The container has a bottom, and a pair of sidewalls extending upwardly from the bottom. An interior region of the container is over the bottom and between the sidewalls. The upper primary portion includes a second conductive constituent configured as a mass filling the interior region of the container. The second conductive constituent is a different composition than the first conductive constituent. One or more conductive projections join to the upper primary portion and extend downwardly from the upper primary portion. Some embodiments include assemblies comprising memory cells over conductive structures. Some embodiments include methods of forming conductive structures.

23 Claims, 13 Drawing Sheets

(51) Int. Cl.
| | |
|---|---|
| *H01L 23/535* | (2006.01) |
| *G11C 16/04* | (2006.01) |
| *H01L 21/768* | (2006.01) |
| *H01L 21/02* | (2006.01) |
| *G11C 16/08* | (2006.01) |
| *H01L 27/11556* | (2017.01) |
| *H01L 27/1157* | (2017.01) |
| *H01L 27/11578* | (2017.01) |
| *H01L 27/11565* | (2017.01) |
| *H01L 29/792* | (2006.01) |
| *H01L 29/788* | (2006.01) |

(52) U.S. Cl.
CPC .. *H01L 21/02532* (2013.01); *H01L 21/76807* (2013.01); *H01L 21/76843* (2013.01); *H01L 21/76877* (2013.01); *H01L 23/535* (2013.01); *H01L 27/1157* (2013.01); *H01L 27/11556* (2013.01); *H01L 27/11565* (2013.01); *H01L 27/11578* (2013.01); *H01L 29/1037* (2013.01); H01L 29/7883 (2013.01); *H01L 29/7889* (2013.01); *H01L 29/7926* (2013.01)

(58) Field of Classification Search
CPC ................. H01L 23/5226; H01L 28/90; H01L 21/76843; H01L 27/76847; H01L 27/76849; H01L 21/76846; H01L 27/11578
See application file for complete search history.

(56) References Cited

U.S. PATENT DOCUMENTS

| | | |
|---|---|---|
| 2015/0340370 A1 | 11/2015 | Kim |
| 2017/0213843 A1 | 7/2017 | Choi |
| 2018/0374866 A1 | 12/2018 | Makala |
| 2019/0019558 A1* | 1/2019 | Lee ................... H01L 27/11565 |

* cited by examiner

CONDUCTIVE STRUCTURES, ASSEMBLIES HAVING VERTICALLY-STACKED MEMORY CELLS OVER CONDUCTIVE STRUCTURES, AND METHODS OF FORMING CONDUCTIVE STRUCTURES

RELATED PATENT DATA

This patent resulted from a divisional application of U.S. patent application Ser. No. 15/852,955, filed Dec. 22, 2017, the disclosures of which are incorporated herein by reference.

TECHNICAL FIELD

Conductive structures, assemblies having vertically-stacked memory cells over conductive structures, and methods of forming conductive structures.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 controls memory operations to be performed on the memory cells 1003 utilizing signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs=32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

Integrated assemblies may utilize conductive wiring structures which contain doped silicon. For instance, three-dimensional NAND may utilize such conductive wiring structures as source lines. It would be desirable to develop improved wiring structures, and improved methods for fabricating such wiring structures.

BRIEF DESCRIPTION OF THE DRAWINGS

FIGS. 6B-1, 6B-2, 6B-3 and 6B-4 are diagrammatic cross-sectional views along the line B-B of FIG. 6 showing example configurations and arrangements of materials in some example embodiments.

FIGS. 7A-1 and 7A-2 are diagrammatic cross-sectional views along the line A-A of FIG. 7 showing example configurations in a pair of example embodiments.

DETAILED DESCRIPTION OF THE ILLUSTRATED EMBODIMENTS

Some embodiments include conductive structures having a doped semiconductor mass within a conductive container. The conductive container may comprise metal. In some embodiments, the conductive container includes one or more projections which may be utilized to electrically couple the conductive container with other circuitry. In some embodiments, conductive structures may be configured as source lines within a NAND memory array. Example embodiments are described with reference to FIGS. 5-14.

Figure 5:
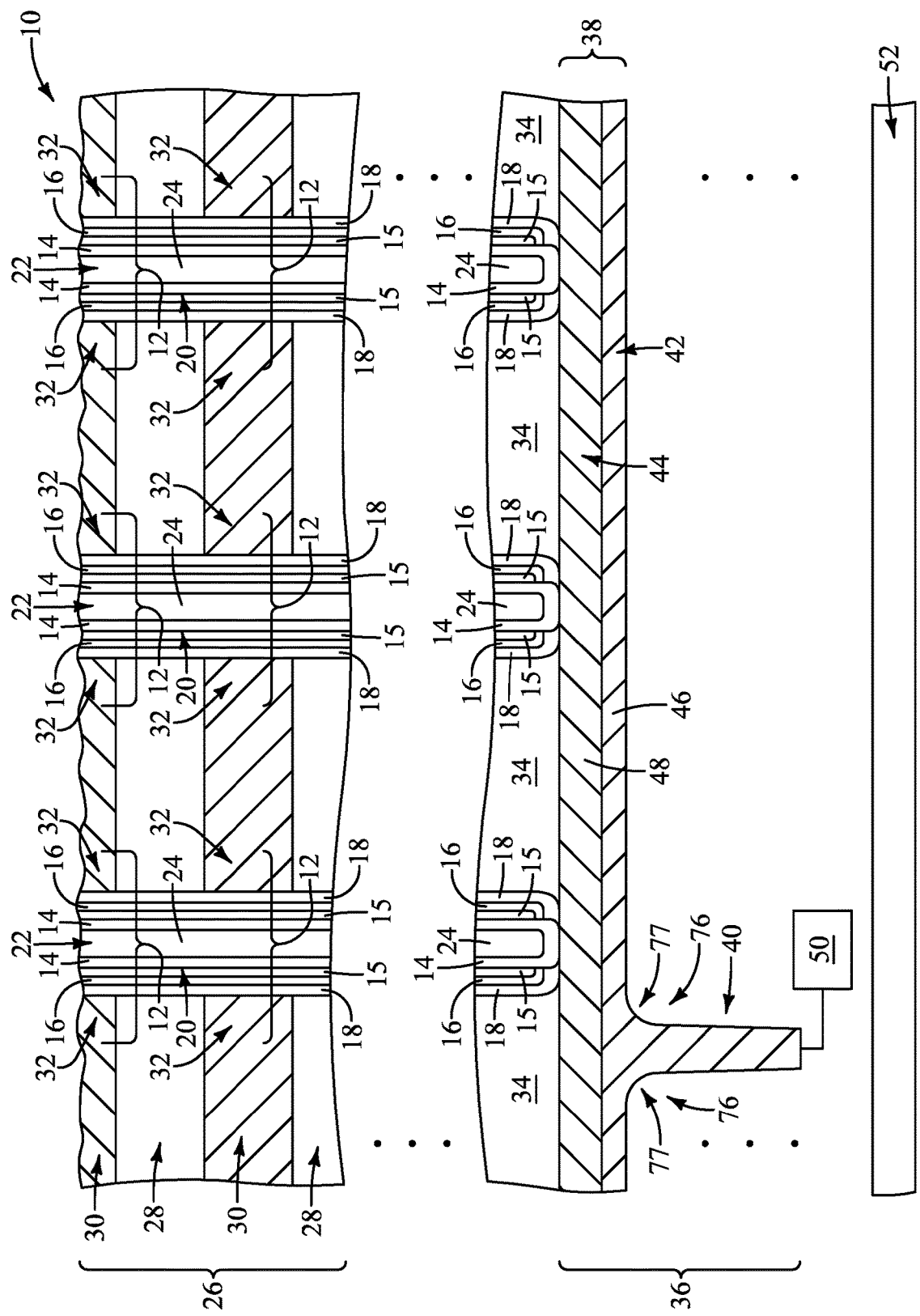
FIG. 5 is a diagrammatic cross-sectional view of a region of an example assembly comprising an example arrangement of memory cells over an example conductive structure.

Referring to FIG. 5, a region of an assembly 10 is illustrated. The assembly 10 includes a plurality of vertically-stacked memory cells 12. Such memory cells may be NAND memory cells, and may be part of a NAND memory array.

The memory cells include channel material 14, tunneling material 15, charge-storage material 16, and charge-blocking material 18.

The channel material 14 is configured as vertically-extending channel material pillars 20. In the illustrated embodiment, the pillars 20 are "hollow" in that they have voids 22 extending therein. Such voids are filled with insulative material 24. In other embodiments, the pillars 20 may be solid rather than being in the illustrated hollow configuration.

The memory cells 12 may be considered to be arranged along the channel material pillars 20.

The channel material 14 may comprise any suitable composition(s); and in some embodiments may comprise one or more of silicon, germanium, III/V semiconductor materials (e.g., gallium phosphide), semiconductor oxides, etc.

The tunneling material 15 is sometimes referred to as gate dielectric. The tunneling material 15 may comprise any suitable composition(s); and in some embodiments may comprise, for example, one or more of silicon dioxide, aluminum oxide, hafnium oxide, zirconium oxide, etc.

The charge-storage material 16 may comprise any suitable composition(s); and in some embodiments may comprise charge-trapping materials, such as silicon nitride, silicon oxynitride, conductive nanodots, etc. In alternative embodiments (not shown), charge-storage material 26 may be configured as floating gate material (such as, for example, polycrystalline silicon).

The charge-blocking material 18 may comprise any suitable composition(s); and in some embodiments may comprise one or more of silicon dioxide, aluminum oxide, hafnium oxide, zirconium oxide, etc.

The insulative material 24 may comprise any suitable composition(s); and in some embodiments may comprise silicon dioxide.

The channel material pillars 20 extend through a stack 26 of alternating insulative levels 28 and conductive levels 30.

The conductive levels 30 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the conductive levels 30 may comprise n-type doped polycrystalline silicon (i.e., n-type doped polysilicon) of SONOS (semiconductor-oxide-nitride-oxide-semiconductor), or metal of MONOS (metal-oxide-nitride-oxide-semiconductor); with an example MONOS being TANOS (tantalum-alumina-nitride-oxide-semiconductor). In some embodiments, the conductive levels 30 may comprise titanium nitride around a metallic core, with the metallic core comprising tungsten or tantalum.

The conductive levels 30 may correspond to wordlines, and may comprise control gates 32 for the memory cells 12. In some embodiments, the vertically-stacked memory cells 12 are configured as NAND strings, with the number of memory cells 12 in the individual strings being determined by the number of conductive levels 30. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

The insulative levels 28 may comprise any suitable composition or combination of compositions; and may, for example, comprise silicon dioxide.

The levels 28 and 30 may be of any suitable thicknesses; and may be the same thickness as one another, or different thicknesses relative to one another.

The channel material pillars 20 extend through an insulative material 34 and contact a conductive structure 36.

The insulative material 34 may comprise any suitable composition(s); and in some embodiments, may comprise, consist essentially of, or consist of silicon dioxide.

A gap is provided between the stack 26 and the insulative material 34 to indicate that there may be additional materials and/or components provided within the assembly 10 which are not shown. For instance, source-side select gates may be provided within the illustrated gap between the stack 26 and insulative material 34.

The conductive structure 36 may correspond to a source line analogous to the source line 216 discussed above with reference to FIG. 4.

The conductive structure 36 includes an upper primary portion 38, and a conductive projection 40 which extends downwardly from the upper primary portion.

The upper primary portion 38 includes a first conductive constituent 42, and a second conductive constituent 44 over the first conductive constituent.

The first conductive constituent 42 comprises a conductive material 46, and the second conductive constituent 44 comprises a conductive material 48 which is compositionally different from the conductive material 46. In some embodiments, the conductive material 46 may comprise metal (e.g., one or more of titanium nitride, tantalum nitride, tungsten, etc.), while the conductive material 48 comprises conductively-doped semiconductor material. In some embodiments, the conductive material 48 of the second conductive constituent 44 may comprise, consist essentially of, or consist of conductively-doped silicon. For instance, the conductive material 48 may comprise n-type polysilicon.

The channel material 14 directly contacts the conductively-doped semiconductor material 48 of the second conductive constituent 44. In some embodiments, such may be desired so that dopant from the conductively-doped semiconductor material 48 may be diffused into the channel material 14 to provide desired dopant levels within channel regions of select gates (not shown).

In the illustrated embodiment of FIG. 5, the channel material pillars 20 extend to an upper surface of the conductive material 48 of the second conductive constituent 44. In other embodiments, the channel material pillars 28 penetrate into the conductive material 48.

The conductive structure 36 is shown to be electrically coupled with circuitry 50. Such circuitry may be any suitable circuitry suitable for operation of the source line 36.

The stack 26 and the conductive structure 36 are shown to be supported over a base 52. The base 52 may comprise semiconductor material; and may, for example, comprise, consist essentially of, or consist of monocrystalline silicon. The base 52 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 52 may correspond to a semiconductor substrate containing one or more materials associated with integrated circuit fabrication. Such materials may include, for example, one or more of refractory metal materials, barrier materials, diffusion materials, insulator materials, etc.

A gap is provided between the structure 36 and the base 52 to indicate that other components and materials may be provided between the structure 36 and the base 52. For instance, the circuitry 50 may be provided within the illustrated gap between the structure 36 and the base 52.

The structure 36 may have any suitable configuration. Example configurations are described with reference to FIGS. 6-8.

Figure 6:
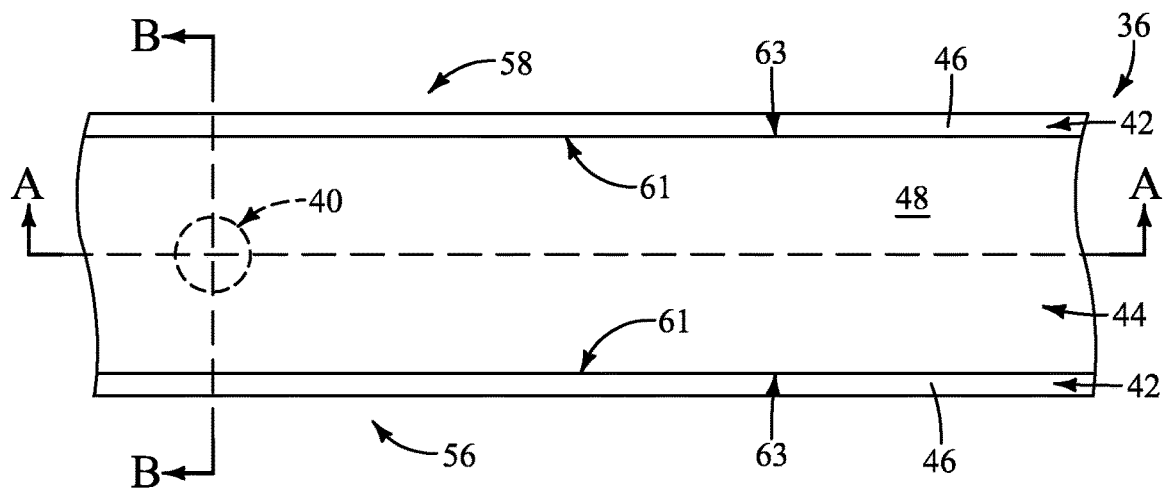
FIG. 6 is a diagrammatic top view of the example conductive structure of FIG. 5.
Figure 6A:
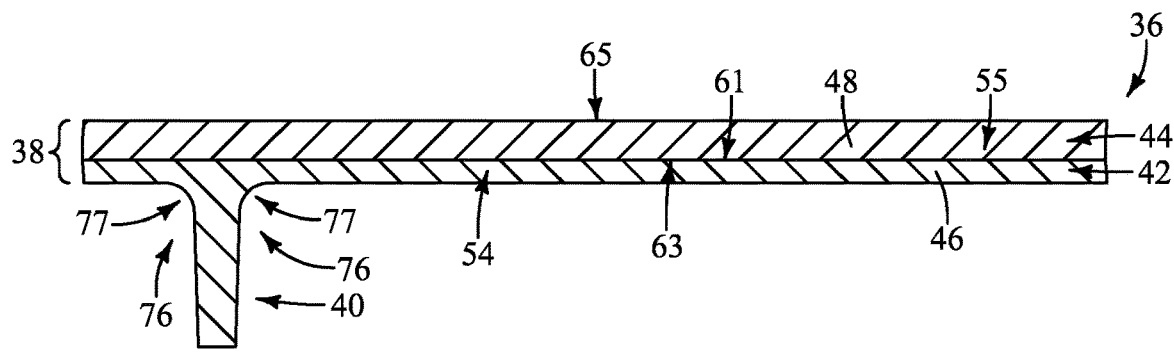
FIGS. 6A and 6B are diagrammatic cross-sectional views along the lines A-A and B-B of FIG. 6, respectively.
Figure 6B:
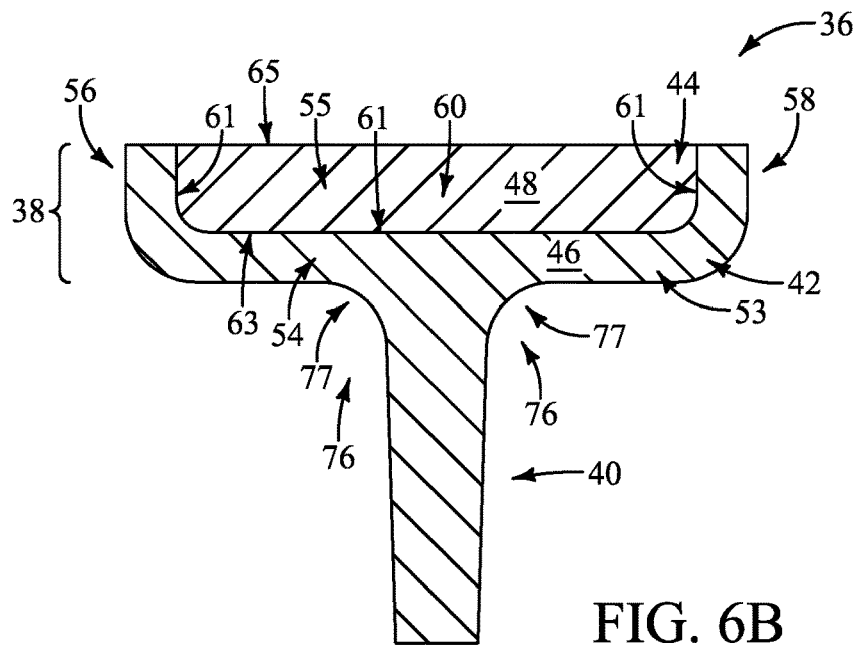
Figures 1, 6B:
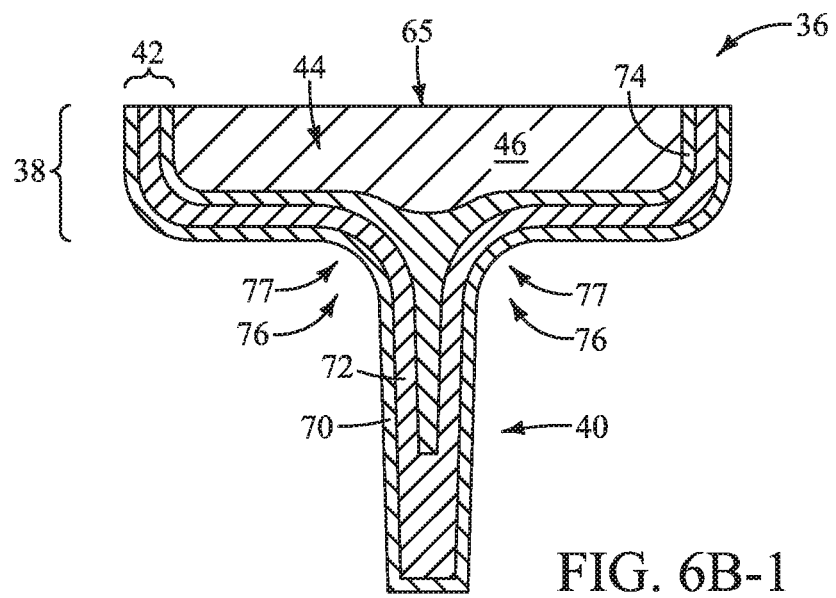
Figures 2, 6B:
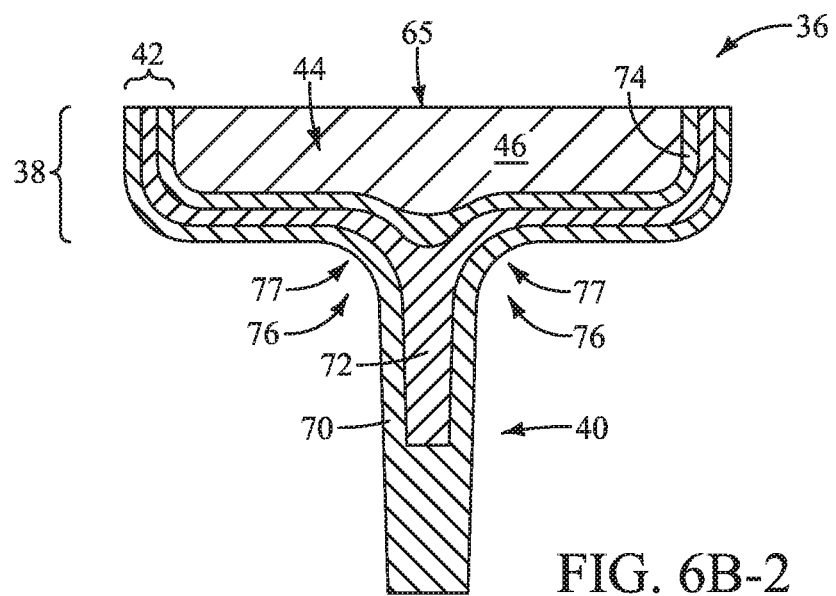
Figures 3, 6B:
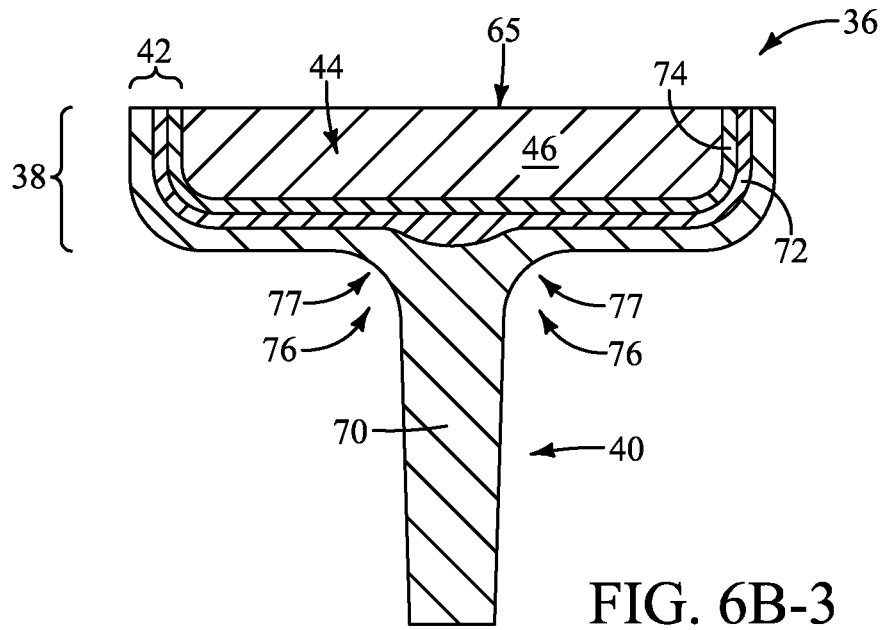
Figures 4, 6B:
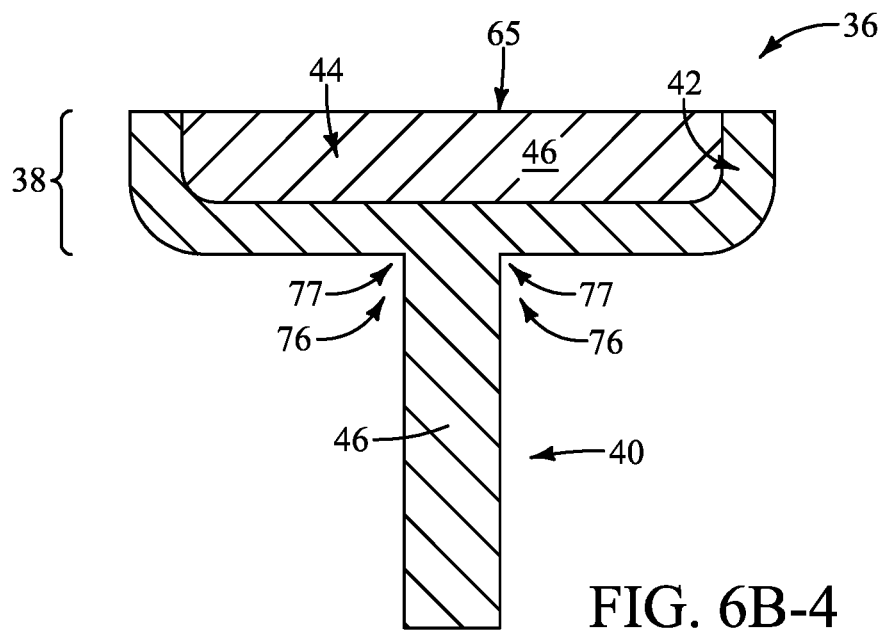

Referring to FIGS. 6, 6A and 6B, the conductive structure 36 is shown in top view (FIG. 6) and a pair of cross-sectional side views (FIGS. 6A and 6B). The cross-sectional view of FIG. 6A is along the line A-A of FIG. 6, and the cross-sectional view of FIG. 6B is along the line B-B of FIG. 6.

The projection 40 is shown in dashed-line (i.e., phantom) view in FIG. 6 to indicate that such projection is beneath the material 48.

FIG. 6B shows that the first conductive constituent 42 of the upper primary portion 38 is configured as a container 53. The container 53 has a bottom 54, and a pair of sidewalls 56 and 58 extending upwardly from the bottom. An interior region 60 of the container 53 is over the bottom 54 and between the sidewalls 56 and 58. The interior region 60 of the container 53 is bounded by a surface 61 which extends along an upper surface of the bottom 54, and along inner surfaces of the sidewalls 56 and 58.

The second conductive constituent 44 of the primary portion 38 is configured as a mass 55 which fills the interior region 60 of the container 53.

The mass 55 joins to the container 53 along an interface 63 that extends along the inner surface 61 of the container 53.

In the illustrated embodiment, a planarized surface 65 extends across upper surfaces of the first and second conductive constituents 42 and 44.

The conductive constituents 42 and 44 may comprise any suitable materials. Example materials are described above with reference to FIG. 5. In some embodiments, the constituents 42 and 44 may be homogeneous (as shown in FIGS. 5, 6, 6A and 6B). In other embodiments, at least one of the constituents 42 and 44 may comprise two or more discrete compositions. Example configurations in which the lower conductive constituent 42 comprises more than one discrete composition are described with reference to FIGS. 6B-1, 6B-2 and 6B-3.

Figure 1:
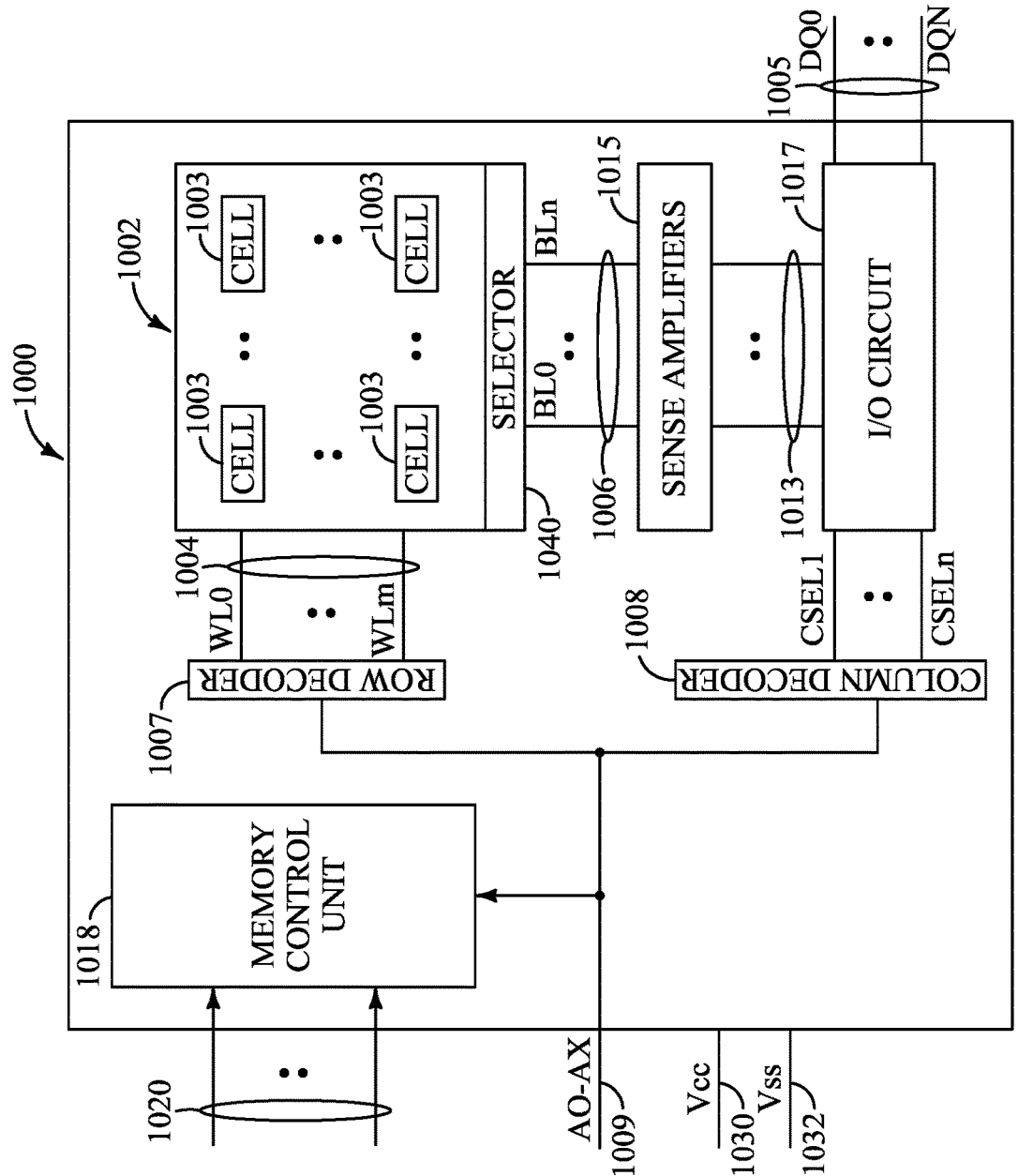
FIG. 1 shows a block diagram of a prior art memory device having a memory array with memory cells.

Referring to FIG. 6B-1, the constituent 42 is shown to comprise three discrete compositions 70, 72 and 74. Such compositions may be metal-containing compositions; and in some embodiments, may be referred to as a first metal-containing material 70, a second metal-containing material 72, and a third metal-containing material 74. In some embodiments, two of the materials 70, 72 and 74 may comprise a same metal as one another, and the other of the materials may comprise a different metal. For instance, in some embodiments the first and third materials 70 and 74 may comprise a same metal as one another (which may be referred to as a first metal), and the second material 72 may comprise a different metal (which may be referred to as a second metal). For instance, in some embodiments the first and third materials 70 and 74 may both comprise, consist essentially of, or consist of titanium nitride, and the second material 72 may comprise, consist essentially of, or consist of tungsten. As another example, in some embodiments the first and third materials 70 and 74 may both comprise, consist essentially of, or consist of tantalum nitride, and the second material 72 may comprise, consist essentially of, or consist of tungsten.

Figure 2:
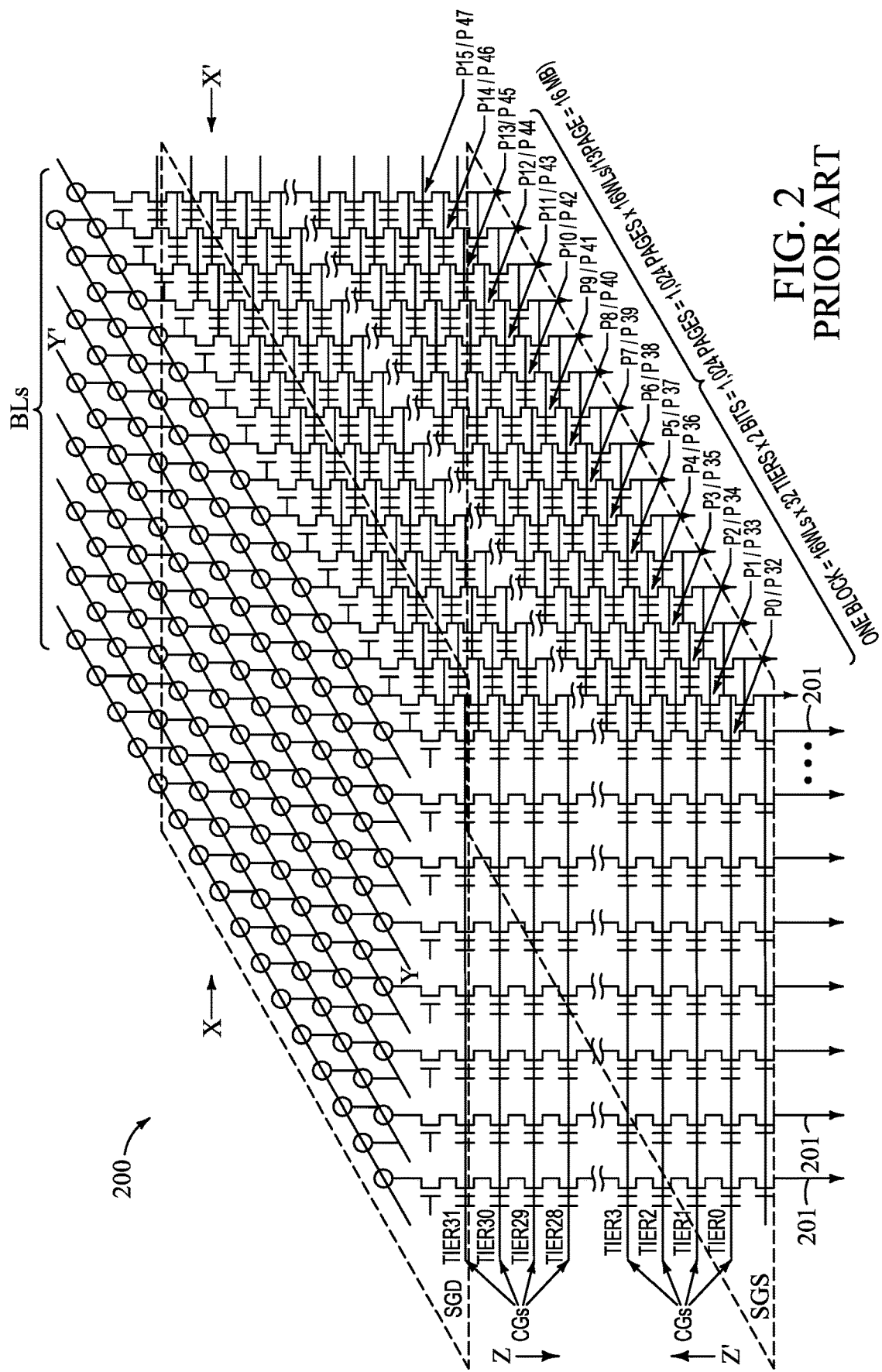
FIG. 2 shows a schematic diagram of the prior art memory array of FIG. 1 in the form of a 3D NAND memory device.
Figure 3:
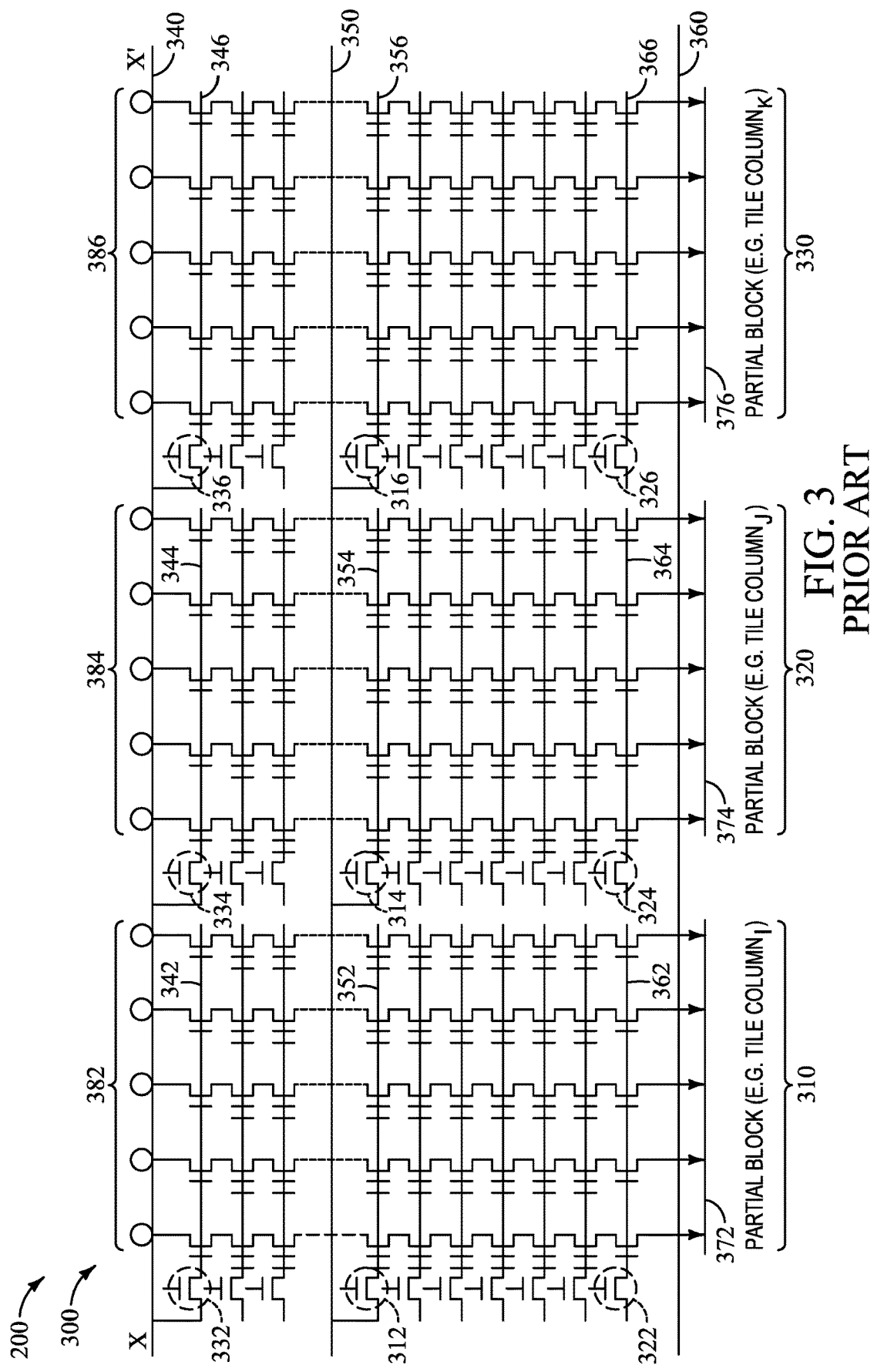
FIG. 3 shows a cross sectional view of the prior art 3D NAND memory device of FIG. 2 in an X-X' direction.

In the embodiment of FIG. 6B-1, all three of the materials 70, 72 and 74 extend into the projection 40. In other embodiments, the projection 40 may comprise only two of the three materials 70/72/74, or only one of such three materials. FIG. 6B-2 shows an embodiment in which the projection 40 comprises only the materials 70 and 72. FIG. 6B-3 shows an embodiment in which the projection 40 comprises only the material 70.

FIGS. 6B-1, 6B-2 and 6B-3 show embodiments in which the conductive constituent 42 comprises three separate materials 70, 72 and 74. In other embodiments, the conductive constituent 42 may comprise fewer than three separate materials (i.e., only a single material, or only two separate materials), or may comprise more than three separate materials. Further, although the constituent 44 is shown to be homogeneous, in other embodiments (not shown) the constituent 44 may comprise two or more different materials.

Figure 4:
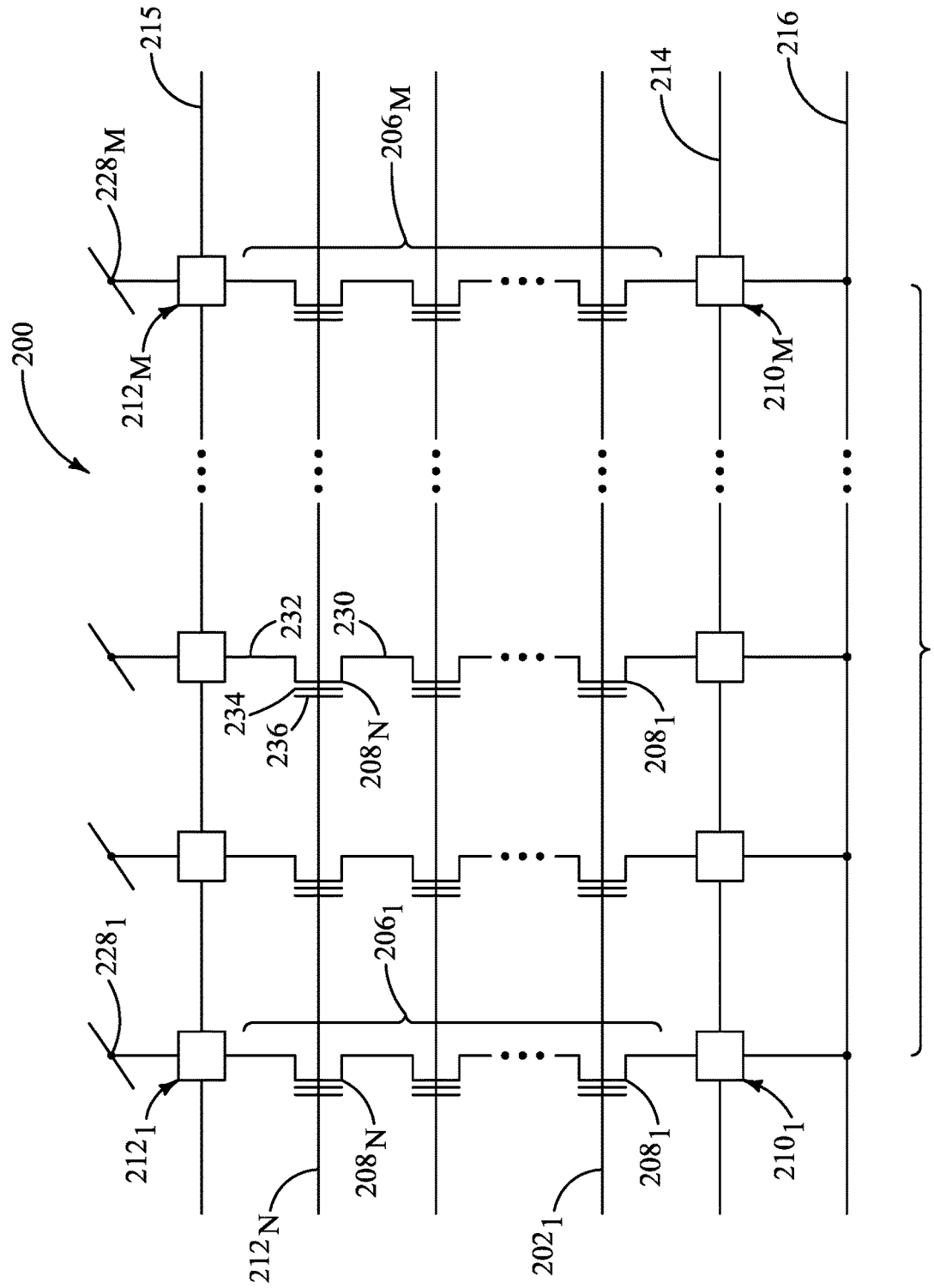
FIG. 4 is a schematic of a prior art NAND memory array.

The embodiments of FIGS. 5, 6, 6A, 6B, 6B-1, 6B-2 and 6B-3 show the projection 40 joining to the upper primary portion 38 of the conductive structure 36 at an interconnecting region 76 having arcuate corners 77 along the various cross-sections shown in the figures. The arcuate corners 77 may be advantageous as compared to more square corners in that it may be easier to uniformly form material across arcuate corners as compared to square corners, adhesion of material along arcuate corners may be enhanced as compared to that along square corners, and the conductive structure 36 may have improved strength along the arcuate corners as compared to a similar structure having square corners. However, although it may be desired to utilize arcuate corners, some embodiments may alternatively utilize square corners. For instance, FIG. 6B-4 shows a configuration of the conductive structure 36 in which the projection 40 joins to the upper primary portion 38 at an interconnecting region 76 having substantially sharp corners 77 along the illustrated cross-section. The sharp corners may have any suitable angles, and in the illustrated embodiment have angles of about 90°.

Although the configurations of FIGS. 5, 6, 6A, 6B, 6B-1, 6B-2, 6B-3 and 6B-4 show the conductive structures 36 comprising only a single projection 40, in other embodiments analogous conductive structures may comprise more than one projection 40. The conductive structures 36 may be utilized as source lines as discussed above with reference to FIG. 5, or may be utilized in other applications within integrated circuits (with the term "integrated circuit" meaning an electronic circuit supported by a semiconductor substrate). The number of projections 40 associated with a conductive structure 36 may be any suitable number of projections appropriate for the application for which the conductive structure 36 is utilized. FIGS. 7, 7A-1, 7A-2, 8, 8A and 8B show example configurations for conductive structures 36 comprising two or more projections 40.

Figure 7:
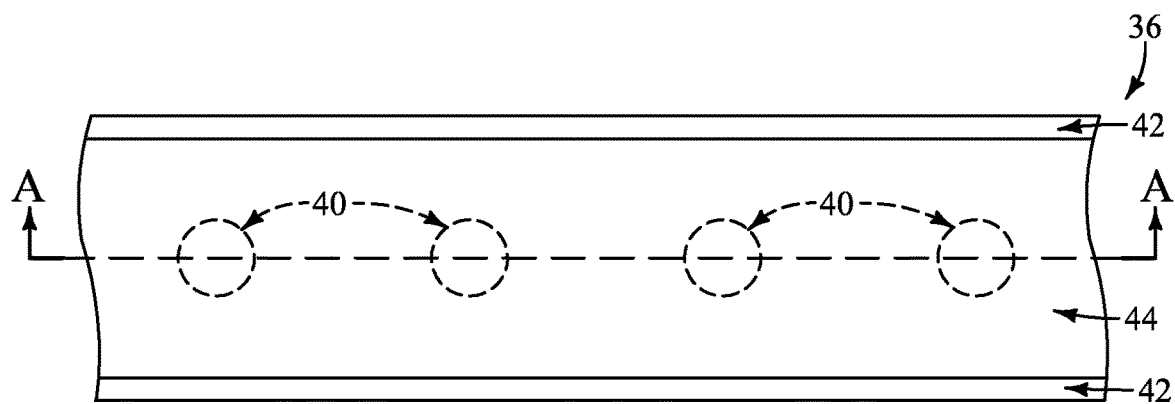
FIG. 7 is a diagrammatic cross-sectional top view of another example conductive structure.
Figures 1, 7A:
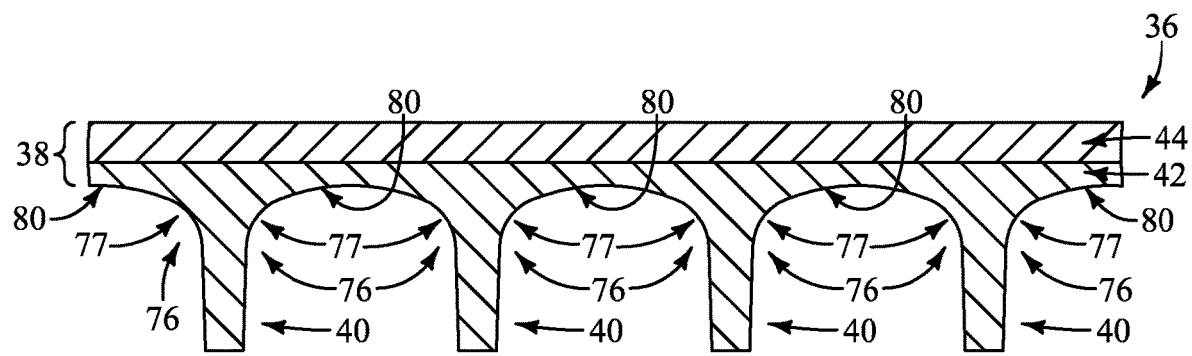
Figures 2, 7A:
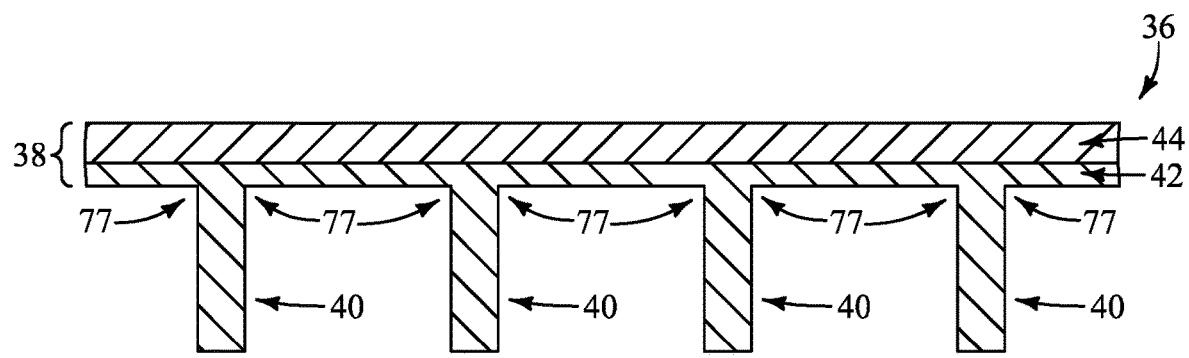
Figure 8:
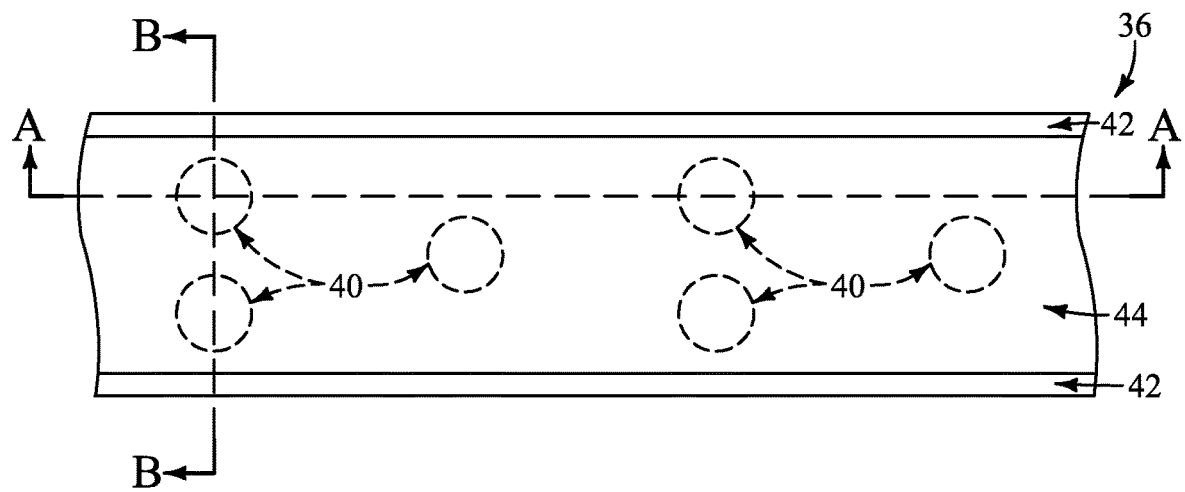
FIG. 8 is a diagrammatic cross-sectional top view of another example conductive structure.
Figure 8A:
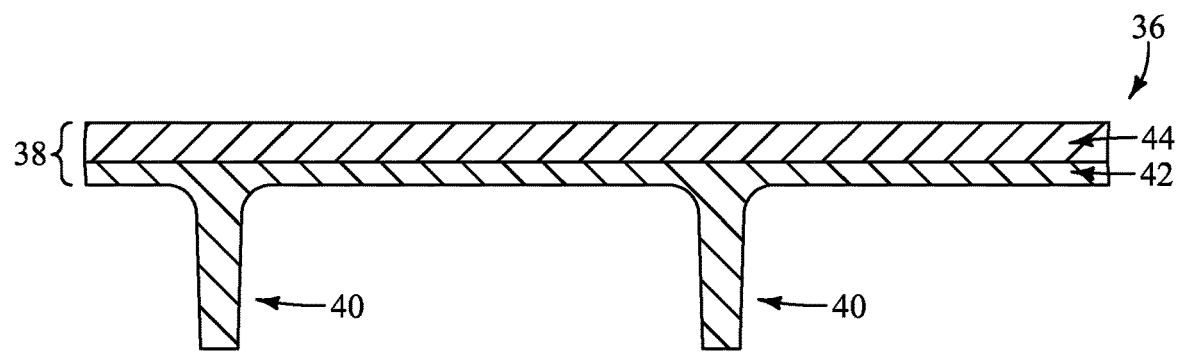
FIGS. 8A and 8B are diagrammatic cross-sectional views along the lines A-A and B-B of FIG. 8, respectively.
Figure 8B:
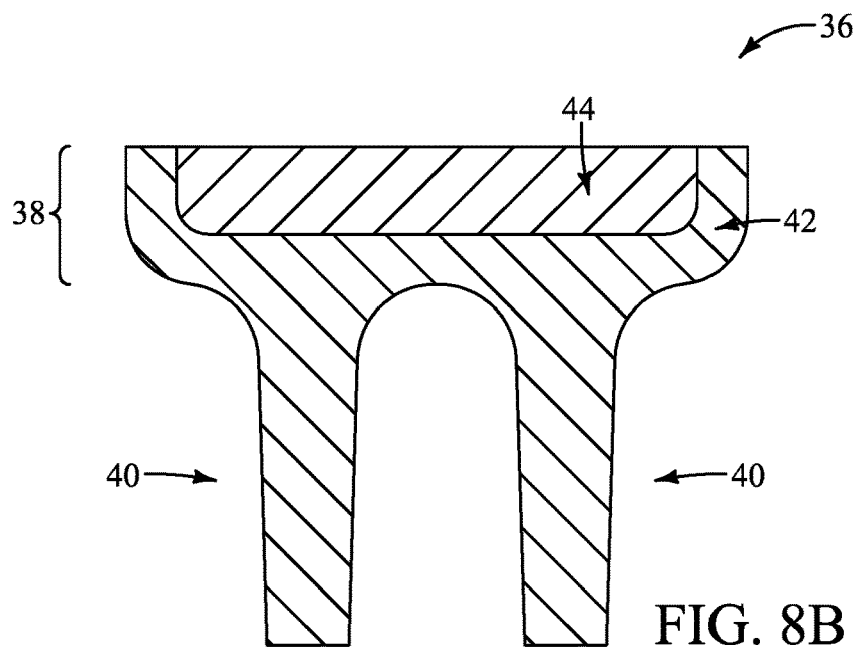

It is noted that the embodiment of FIG. 7A-1 shows the projections 40 joining to the upper primary portion 38 of the conductive structure 36 through interconnecting regions 76 having arcuate corners 77. Such arcuate corners may provide any or all of the advantages described above. Further, arches 80 are formed between neighboring projections 40 where arcuate corners join to one another. The arches 80 may provide advantages of enhanced structural strength as compared to non-arched structures. FIG. 7A-2 shows an analogous embodiment, but in which the corners 77 are sharp. Such embodiment may be less preferred than that of FIG. 7A-1 for at least the reason that the arches 80 are lacking.

The structures described above may be formed with any suitable processing. Example processing is described with reference to FIGS. 9-14.

Figure 9:
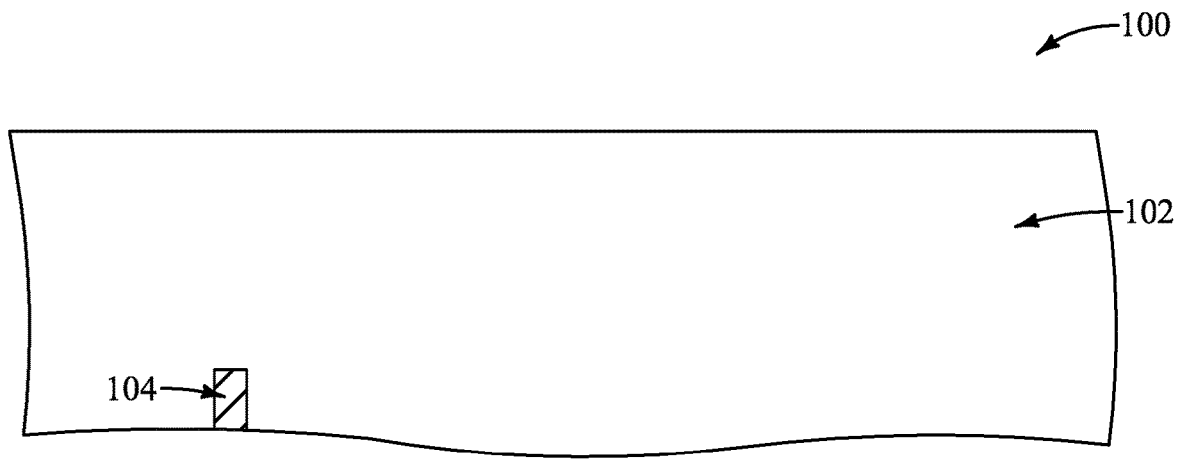
FIGS. 9-14 are diagrammatic cross-sectional views of a region of an example construction at example process stages of an example method for fabricating an example arrangement of memory cells.

Referring to FIG. 9, a construction 100 comprises an insulative mass 102 extending across a conductive pedestal 104. The mass 102 and the pedestal 104 may be supported by a semiconductor base 52 of the type described above with reference to FIG. 5 (not shown in FIG. 9).

The insulative mass 102 may comprise any suitable composition(s); and in some embodiments may comprise, consist essentially of, or consist of silicon dioxide. The mass 102 may be homogeneous (as shown) or may comprise multiple discrete compositions.

The conductive pedestal 104 is an example of a conductive interconnect. Such conductive pedestal may comprise any suitable composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The pedestal 104 may be homogeneous (as shown), or may comprise multiple discrete compositions.

Figure 10:
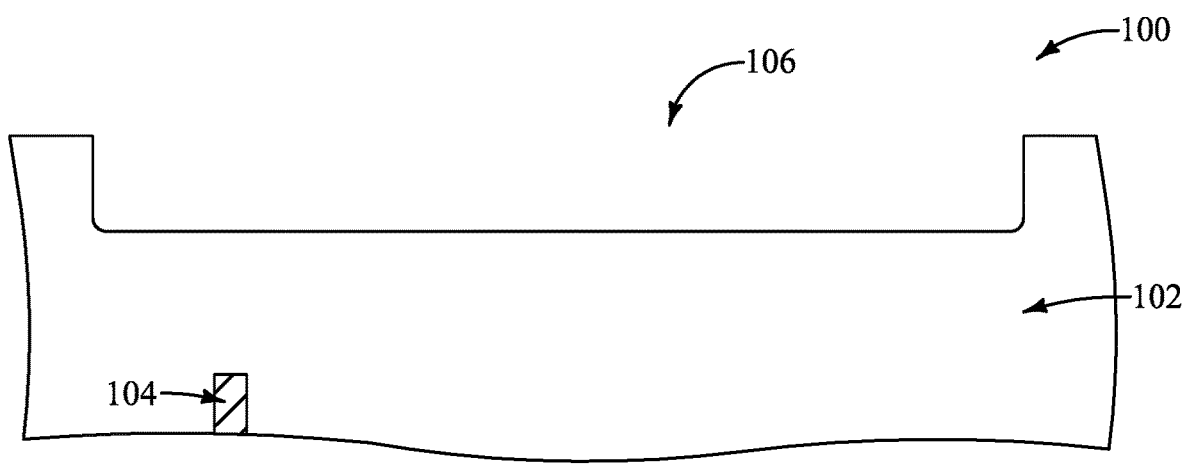

Referring to FIG. 10, a trench 106 is formed to extend into the insulative mass 102.

Figure 11:
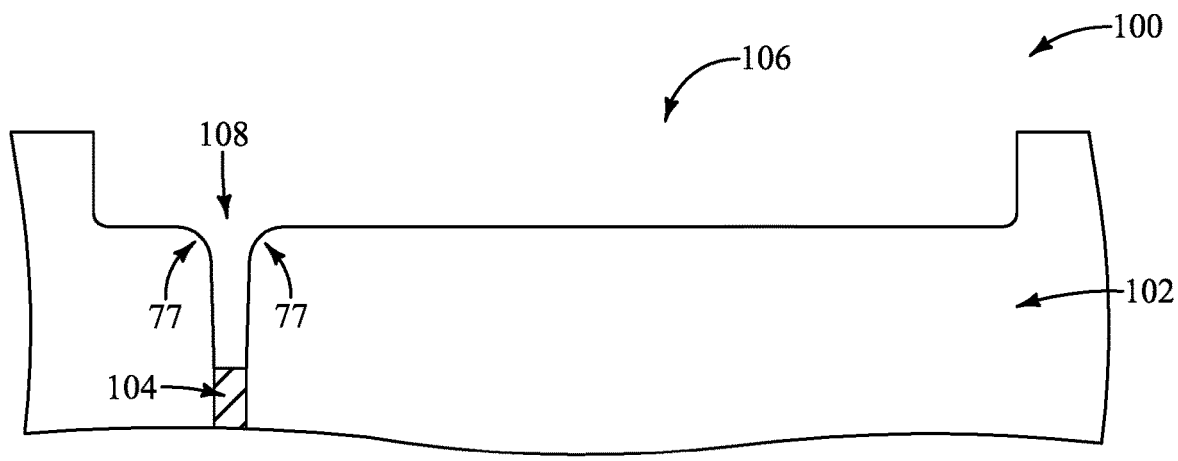

Referring to FIG. 11, a via (i.e., hole) 108 is formed to extend downwardly from the trench 106 and into the insulative mass 102. In the shown embodiment, the via 108 extends to an upper surface of the conductive pedestal 104. Although only one via 108 is shown, in other embodiments multiple vias may be formed to extend downwardly from the trench 106.

The trench 106 and via 108 may be patterned with any suitable processing. In some embodiments, the via 108 may be patterned utilizing a first reticle to define the location of the via, followed by appropriate etching into the insulative mass 102. Subsequently, the trench 106 may be patterned with a second reticle to define the location of the trench, followed by appropriate etching into the insulative mass 102. The processing may form the rounded corners 77 (i.e., the arcuate corners 77) of FIG. 11. Alternatively, the trench 106 and the via 108 may be fabricated utilizing a dual-damascene process or other appropriate process, which may or may not form the rounded corners 77 (e.g., which may instead form square corners of the type described above with reference to FIG. 6B-4).

Figure 12:
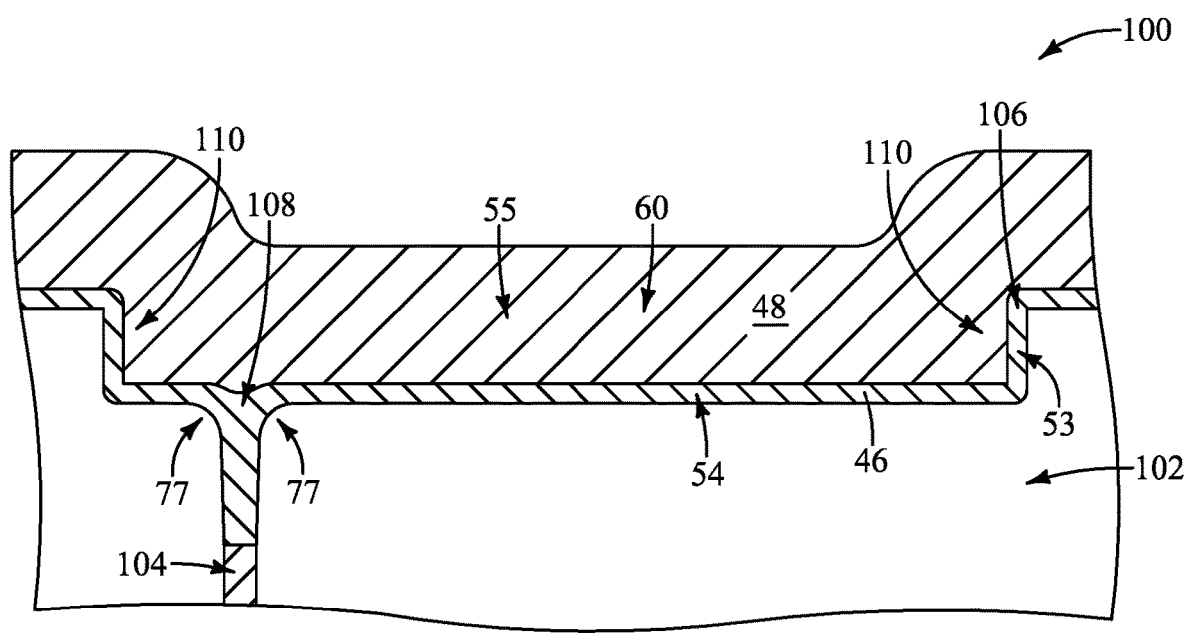

Referring to FIG. 12, conductive materials 46 and 48 are formed within the trench 106 and the via 108. The conductive materials 46 and 48 may be the same as those described above with reference to FIG. 5. The conductive materials 46 and 48 may be homogeneous (as shown). Alternatively, one or both of the conductive materials 46 and 48 may comprise multiple discrete compositions. For instance, in some embodiments the material 46 may comprise the three discrete compositions 70, 72 and 74 described above with reference to FIG. 6B-1.

The material 46 lines the trench 106 to form a conductive container 53 within the trench. The conductive container 53 comprises a bottom 54 and sidewalls 110 extending upwardly from the bottom (the sidewalls 110 of FIG. 12 are at ends of the container 53 and may be called end-walls; other sidewalls 56 and 58—not shown in FIG. 12, but like those of FIG. 6B—would be along sides of the container). An interior region 60 of the container is over the bottom 54 and between the sidewalls 110.

The material 48 forms a conductive mass 55 within the interior region 60. The material 48 may comprise conductively-doped semiconductor material, as described above with reference to FIG. 5.

Figure 13:
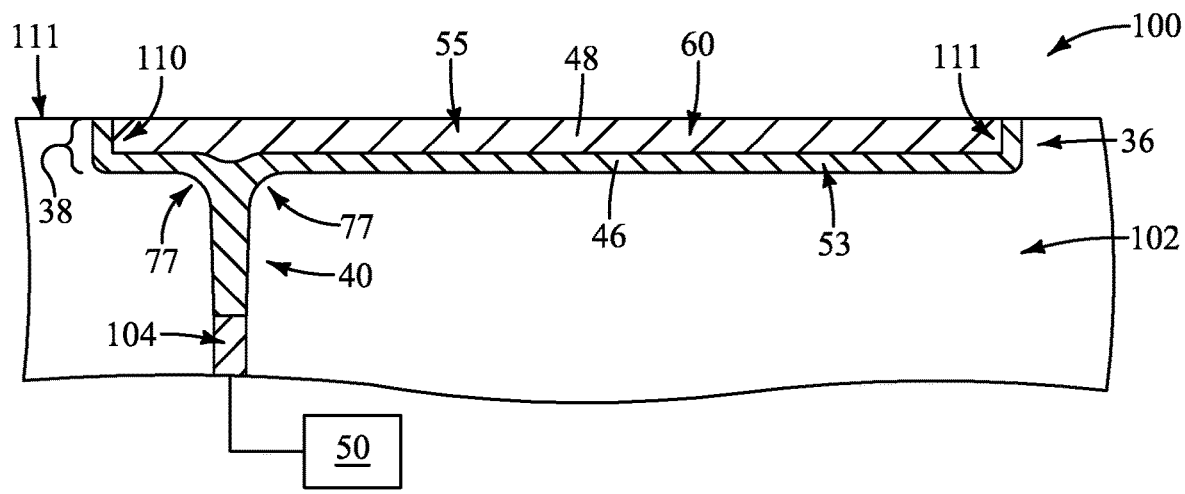

Referring to FIG. 13, construction 100 is subjected to planarization (e.g., chemical-mechanical polishing) to form a planarized surface 111 extending across upper surfaces of the insulative mass 102, the material 46 and the material 48. The planarization may be considered to remove the material 48 from across the sidewalls 110 of the container 53 (with the material 48 being shown to extend across the sidewalls 110 at the process stage of FIG. 12). The planarization may also remove material 48 from over sidewalls of the type shown in FIG. 6B as sidewalls 56 and 58.

The materials 46 and 48 together form a conductive structure 36 of the type described above with reference to FIG. 5. Such conductive structure comprises the upper primary portion 38, and the conductive projection 40. In the illustrated embodiment, the conductive projection 40 extends to the conductive plug 104, which in turn may extend to circuitry 50 of the type described above with reference to FIG. 5.

Figure 14:
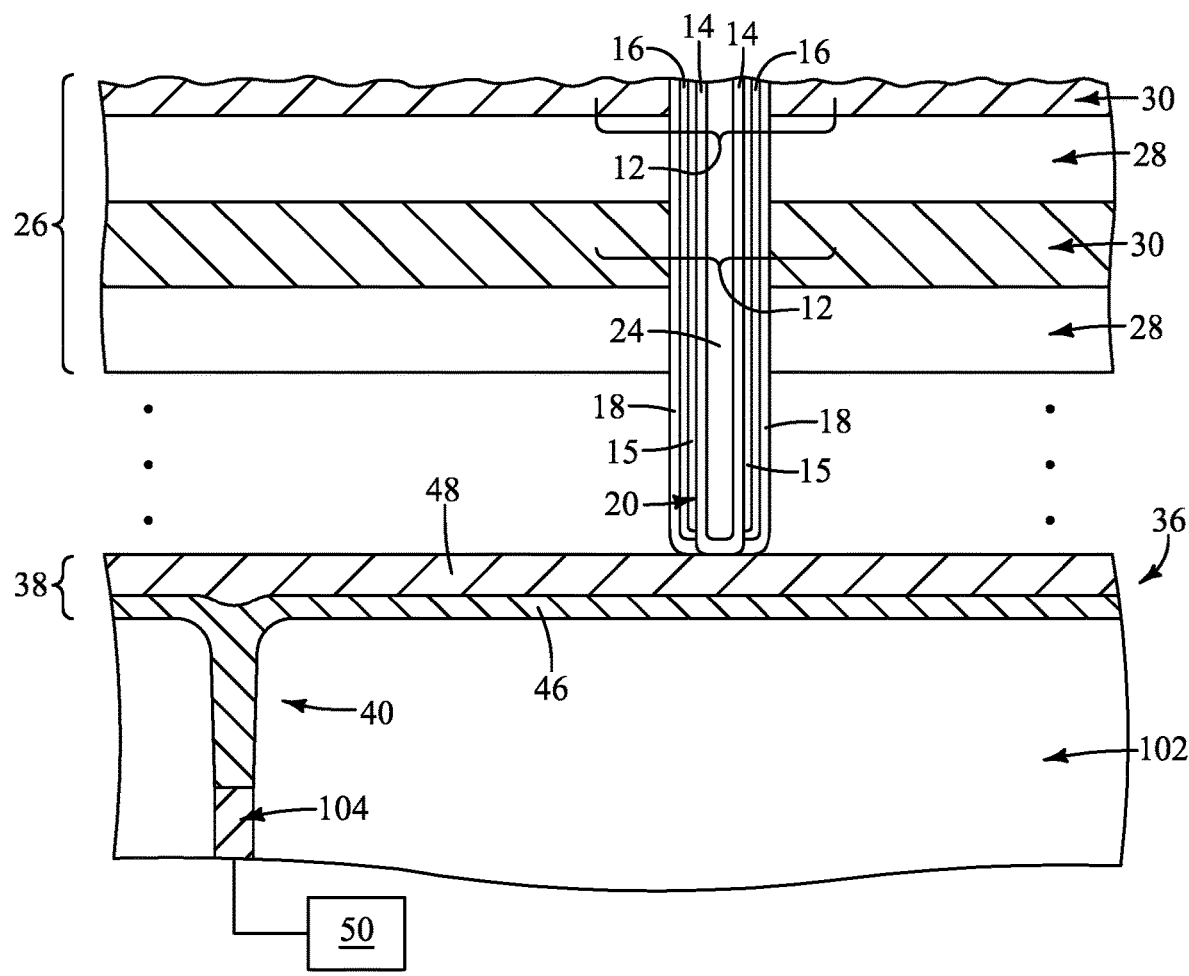

Referring to FIG. 14, a stack 26 of the insulative levels 28 and the conductive levels 30 is formed over the conductive structure 36. Also, a channel material pillar 20 of the type described above with reference to FIG. 5 is formed to extend to the conductively-doped semiconductor material 48 of the conductive structure 36. The tunneling material 15, charge-storage material 16 and charge-blocking material 18 are formed along the channel material pillar 20. Accordingly, memory cells 12 are formed over the conductive structure 36, with the memory cells being along the channel material pillar 20. The pillar 20 may be representative of a large number of substantially identical channel material pillars, and the memory cells 12 may be representative of a large number of substantially identical memory cells of a memory array (for instance, a NAND memory array). The term "substantially identical" means identical to within reasonable tolerances of fabrication and measurement.

The assemblies and structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a conductive structure of an integrated circuit. The conductive structure includes an upper primary portion, with the upper primary portion having a first conductive constituent configured as a container. The container has a bottom and a pair of sidewalls extending upwardly from the bottom. An interior region of the container is over the bottom and between the sidewalls. The upper primary portion includes a second conductive constituent configured as a mass filling the interior region of the container. The second conductive constituent is a different composition than the first conductive constituent. The second conductive constituent joins to the first conductive constituent along an interface that extends along interior surfaces of the sidewalls of the container and across an upper surface of the bottom of the container. One or more conductive projections join to the upper primary portion and extend downwardly from the upper primary portion.

Some embodiments include an assembly having channel material pillars which extend vertically, having memory cells along the channel material pillars, and having a conductive structure under the channel material pillars. The conductive structure includes an upper primary portion, and one or more conductive projections joined to the upper primary portion and extending downwardly from the upper primary portion. The upper primary portion includes a first conductive constituent configured as a container having a bottom and having a pair of sidewalls extending upwardly from the bottom. An interior region of the container is over the bottom and between the sidewalls. The upper primary portion also includes a second conductive constituent configured as a mass filling the interior region of the container. The second conductive constituent comprises a different composition than the first conductive constituent. The second conductive constituent joins to the first conductive constituent along an interface that extends along interior surfaces of the sidewalls of the container and across an upper surface of the bottom of the container. The second conductive constituent comprises conductively-doped semiconductor material and is directly against the channel material pillars.

Some embodiments include a method of forming a conductive structure. A trench is formed to extend into an insulative mass. One or more vias are formed to extend downwardly from the trench and into the insulative mass. One or more metal-containing conductive materials are formed within the one or more vias and within the trench. Said one or more metal-containing conductive materials fill the one or more vias to form a conductive projection within each of said one or more vias. Said one or more metal-containing conductive materials line the trench to form a conductive container within the trench. The conductive container has a bottom, and has a pair of sidewalls extending upwardly from the bottom. An interior region of the container is over the bottom and between the sidewalls. A conductive mass is formed within the interior region of the container. The conductive mass comprises conductively-doped semiconductor material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a conductive structure, comprising:
    forming a trench extending into an insuiative mass, and forming one or more vias extending downwardly from the trench and into the insulative mass;
    forming one or more metal-containing conductive materials within the one or more vias and within the trench; said one or more metal-containing conductive materials filling the one or more vias to form a conductive projection within each of said one or more vias; a first metal-containing conductive material of said one or more metal-containing conductive materials comprising a continuous structure lining an entirety of a periphery of the trench and the first metal-containing conductive material lining an entirety of a periphery of the one or more vias; a second metal-containing conductive material of the one or more metal-containing conductive materials comprising a continuous structure against an entirety of the first metal-containing conductive material; the one or more metal-containing conductive materials form a conductive container within the trench; the conductive container having a bottom and having a pair of sidewalls extending upwardly from the bottom; an interior region of the container being over the bottom and being between the sidewalls; and
    forming a conductive mass within the interior region of the container, the conductive mass comprising conductively-doped semiconductor material.

2. The method of claim 1 wherein the first metal-containing conductive material comprising titanium nitride, the second metal-containing conductive material over the first metal-containing conductive material and comprising tungsten, and a third metal-containing conductive material over the second metal-containing conductive material and comprising titanium nitride.

3. The method of claim 1 wherein the conductively-doped semiconductor material comprises n-type silicon.

4. The method of claim 1 wherein the conductive mass is formed to fill the trench and extend across the sidewalls, and comprising planarizing the container and the conductive mass to remove the conductive mass from over the sidewalls and form a planarized surface extending across the conductive mass and the sidewalls.

5. The method of claim 1 further comprising forming vertically-extending channel material pillars over the conductive mass and directly against the conductive mass, and forming memory cells along the vertically-extending channel material pillars.

6. The method of claim 1 wherein the one or more vias join to the trench at arcuate surfaces.

7. The method of claim 6 wherein the one or more vias are patterned with a first reticle, and wherein the trench is patterned with a second reticle.

8. The method of claim 1 wherein the interior region of the container is entirely filled with the conductively-doped semiconductor material.

9. The method of claim 1 wherein the conductively-doped semiconductor material in the interior region contacts the one or more metal-containing conductive materials in the one or more vias.

10. The method of claim 1 wherein the entire bottom of the conductive container comprises at least three metal-containing conductive materials.

11. The method of claim 1 wherein the conductive container comprises at least three metal-containing conductive materials, and wherein one of the at least three metal-containing conductive materials is entirely spaced from another one of the at least three metal-containing conductive materials.

12. The method of claim 1 wherein the second metal-conductive material comprises a continuous structure for an entirety of the structure.

13. The method of claim 1 further comprising forming a third metal-containing conductive material, an entire one side of the third metal-containing conductive material is against only the second metal-containing conductive material.

14. The method of claim 1 further comprising forming a channel of a memory cell directly contacting the conductive structure.

15. The method of claim 14 further comprising diffusing dopant from the conductive mass into the channel.

16. The method of claim 2 wherein the third metal-containing conductive material is entirely spaced from the first metal-containing conductive material.

17. The method of claim 16 wherein the third metal-containing conductive material comprises tantalum nitride.

18. The method of claim 1 wherein the conductive structure comprises a source line.

19. The method of claim 1 wherein the first metal-containing conductive material comprises tantalum nitride.

20. The method of claim 1 wherein the forming of the trench occurs before the forming of the one or more vias.

21. The method of claim 1 further comprising forming a stack of alternating insulative levels and conductive levels over the conductive structure.

22. The method of claim 1 further comprising forming a memory cell over the conductive structure.

23. The method of claim 1 further comprising forming charge-blocking material against the conductive structure.

\* \* \* \* \*